(12) United States Patent
Zhan et al.

(10) Patent No.: US 10,527,894 B2
(45) Date of Patent: Jan. 7, 2020

(54) DISPLAY MODULE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Jianghui Zhan, Beijing (CN); Wei Lei, Beijing (CN); Jinmoo Park, Beijing (CN); Zhuhua Nie, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 28 days.

(21) Appl. No.: 15/115,086

(22) PCT Filed: Jan. 4, 2016

(86) PCT No.: PCT/CN2016/070009
§ 371 (c)(1),
(2) Date: Jul. 28, 2016

(87) PCT Pub. No.: WO2017/020543
PCT Pub. Date: Feb. 9, 2017

(65) Prior Publication Data
US 2018/0173041 A1    Jun. 21, 2018

(30) Foreign Application Priority Data

Aug. 6, 2015 (CN) .......................... 2015 1 0477811

(51) Int. Cl.
G02F 1/1345 (2006.01)
H05K 1/14 (2006.01)
(Continued)

(52) U.S. Cl.
CPC .... *G02F 1/13452* (2013.01); *G02F 1/133308* (2013.01); *H05K 1/028* (2013.01);
(Continued)

(58) Field of Classification Search
CPC ........ H05K 1/147; H05K 1/148; H05K 1/028; H05K 1/189; H05K 2201/046;
(Continued)

(56) References Cited

U.S. PATENT DOCUMENTS 5,404,239 A * 4/1995 Hirai .................... G02F 1/13452
174/254
7,339,646 B2 * 3/2008 Izawa ................. G02F 1/13452
349/150

(Continued)

FOREIGN PATENT DOCUMENTS

CN    101008753 A    8/2007
CN    202394008 U    8/2012
(Continued)

OTHER PUBLICATIONS

PCT International Search Report & Written Opinion dated Aug. 6, 2015, Application No. PCT/CN2016/070009, 13 Pages.
(Continued)

*Primary Examiner* — Steven T Sawyer
*Assistant Examiner* — Paresh H Paghadal
(74) *Attorney, Agent, or Firm* — Brooks Kushman P.C.

(57) ABSTRACT

The present disclosure provides a display panel and a backlight module opposite to the display panel. A circuit board is arranged at a first edge of the display panel, the circuit board is folded to extend from a first surface of the display panel away from the backlight module to a second surface of the backlight module away from the display panel, and at least one folding portion is arranged at a portion of the circuit board between the display panel and
(Continued)

the backlight module. The display module further includes a cell tape configured to connect the display panel to the backlight module. The cell tape includes: a first region, attached to an edge of the first surface of the display panel; a second region, attached to an edge of the second surface of the backlight module; and a folding region, which is arranged between the first region and the second region, and connects the first region to the second region. At least one avoidance portion is arranged in the folding region and configured to avoid the folding portion of the circuit board.

14 Claims, 2 Drawing Sheets

(51) Int. Cl.
  *G02F 1/1333* (2006.01)
  *H05K 1/02* (2006.01)
  *H05K 1/11* (2006.01)
  *H05K 1/18* (2006.01)
(52) U.S. Cl.
  CPC ......... *H05K 1/147* (2013.01); *G02F 2201/46* (2013.01); *H05K 1/111* (2013.01); *H05K 1/116* (2013.01); *H05K 1/189* (2013.01); *H05K 2201/09063* (2013.01); *H05K 2201/10136* (2013.01)
(58) Field of Classification Search
  CPC .......... H05K 2201/09063; H05K 2201/10136; G02F 1/13452; G02F 1/13308
  See application file for complete search history.

(56) References Cited

U.S. PATENT DOCUMENTS

| | | | |
|---|---|---|---|
| 7,342,178 B2* | 3/2008 | Yang | H05K 1/028 174/254 |
| 7,572,982 B2* | 8/2009 | Joon | C25D 5/02 174/254 |
| 7,812,913 B2 | 10/2010 | Oohira | |
| 7,903,193 B2* | 3/2011 | Oohira | G02B 6/0088 349/58 |
| 8,367,936 B2* | 2/2013 | Su | H05K 1/0281 174/254 |
| 2005/0190531 A1* | 9/2005 | Gall | H05K 1/0278 361/600 |
| 2007/0177093 A1* | 8/2007 | Oohira | H05K 1/028 349/150 |
| 2008/0180255 A1* | 7/2008 | Isabell | G06K 19/07749 340/572.8 |
| 2010/0142178 A1 | 6/2010 | Yee et al. | |
| 2012/0106092 A1* | 5/2012 | Chen | H04M 1/233 361/728 |
| 2013/0288091 A1* | 10/2013 | Tsubaki | G01K 1/14 429/90 |
| 2015/0022953 A1* | 1/2015 | Cho | H05K 1/028 361/679.01 |

FOREIGN PATENT DOCUMENTS

| | | |
|---|---|---|
| CN | 103018938 A | 4/2013 |
| CN | 103424905 A | 12/2013 |
| CN | 204442826 U | 7/2015 |
| CN | 104991369 A | 10/2015 |
| JP | 2001318618 A | 11/2001 |
| KR | 20120018677 A | 3/2012 |
| KR | 20120118354 A | 10/2012 |

OTHER PUBLICATIONS

First Office Action for Chinese Application No. 201510477811.5, dated Jul. 27, 2017, 7 pages.

International Search Report and Written Opinion for Application No. PCT/CN2016/070009, dated Apr. 26, 2016, 10 pages.

* cited by examiner

DISPLAY MODULE AND DISPLAY DEVICE

CROSS-REFERENCE TO RELATED APPLICATION

This application is the U.S. national phase of PCT Application No. PCT/CN2016/070009 filed on Jan. 4, 2016, which claims priority to Chinese patent application No. 201510477811.5 filed on Aug. 6, 2015, the disclosures of which are incorporated herein by reference in their entirety.

TECHNICAL FIELD

The present disclosure relates to the field of the display technology, in particular to a display module and a display device.

BACKGROUND

In the liquid crystal module with a small size, a backlight source (BLU) is generally fixed to a display panel using a cell tape.

One side of the display panel is generally provided with a circuit board. The circuit board includes a drive IC, an printed circuit board (PCBA) and a flexible circuit board (FPC) connecting the drive IC to the printed circuit board. The drive IC is bonded to the display panel.

When the backlight source and the display panel are assembled, the display panel and the backlight are buckled together firstly, and the flexible circuit board on the display panel is folded to a back of the display panel to be fixed onto a back plate of the backlight source. Then, the cell tape is used to fully attach four edges of a polarized light sheet (POL) at a front surface of the display panel, and it is folded to the back plate of the backlight source at a back surface of the display panel, wherein at a side of the display panel that has a circuit board, the cell tape overlaps with the circuit board after being folded so as to be attached to the circuit board. The cell tape may function to fix the display panel and the backlight source in one aspect, and may function to protect all the circuit components in another aspect.

Due to differences between the attaching accuracy and the dimensional tolerance and differences between the attaching accuracy and the material property, the cell tape and the circuit board cannot well overlap during a folding process. If the cell tape is attached too tightly, it will apply a pressure that is pulled to a back surface of the display panel to the flexible circuit board, and then, the flexible plate will pull the drive IC so that the display panel is locally deformed due to stress so as to cause an light leakage. The light leakage is particularly apparent against a full-black screen, and it is commonly known as L0 light leakage.

SUMMARY

An object of the present disclosure is to provide a display module and a display device. The display module and the display device can avoid an adverse light leakage that occurs to a display panel, which is caused when a cell tape pulls a flexible circuit board, upon fixing the display panel and the backlight module.

A display module is provided by the present disclosure, including: a display panel and a backlight module opposite to the display panel, where a circuit board is arranged at a first edge of the display panel, the circuit board is folded to extend from a first surface of the display panel away from the backlight module to a second surface of the backlight module away from the display panel, and at least one folding portion is arranged at a portion of the circuit board between the display panel and the backlight module; and a cell tape configured to at least cover each folding portion and connect the display panel to the backlight module. The cell tape includes: a first region, attached to an edge of the first surface of the display panel; a second region, attached to an edge of the second surface of the backlight module; and a folding region, which is arranged between the first region and the second region, and connects the first region to the second region. At least one avoidance portion is arranged in the folding region and configured to avoid the folding portion of the circuit board.

Further, the avoidance portion includes at least one opening in the folding region of the cell tape.

Further, the opening is rectangular and extends along a direction identical to the first edge of the display panel.

Further, the at least one opening is a plurality of holes of predetermined diameters.

Further, the avoidance portion comprises at least one cavity arranged in the folding region of the cell tape and extending along a direction away from the folding portion.

Further, the folding region of the cell tape corresponds to the at least one folding portion as a whole, and a region of the cell tape corresponding to each of the at least one folding portion is of elasticity greater than the other regions of the cell tape.

Further, a length of each of the at least one avoidance portion along an extending direction of the first edge is equal to or greater than a length of the folding portion along the extending direction of the first edge.

Further, a width of each of the at least one avoidance portion along a second direction perpendicular to the first surface of the display panel is equal to or greater than a length of the folding portion along the second direction.

Further, the circuit board includes a drive integrated circuit (IC), an printed circuit board and at least one flexible circuit board connecting the drive IC to the printed circuit board, wherein the drive IC is bonded to the display panel, each of the at least one flexible circuit board is folded to extend from the first surface of the display panel to the second surface of the backlight module so as to form the folding portion and fix the printed circuit board onto the second surface of the backlight module.

A display device is provided by the present disclosure, including the above-mentioned display module.

A display module is further provided by the present disclosure, including
a display panel and a backlight module opposite to the display panel, wherein a circuit board is arranged at a first edge of the display panel, the circuit board is folded to extend from a first surface of the display panel away from the backlight module to a second surface of the backlight module away from the display panel;
where the circuit board includes
a first portion, bonded to the first surface of the display panel;
a second portion, fixed onto the second surface of the backlight module; and
at least one folding portion, arranged between the first portion and the second portion of the circuit board and connecting the first portion to the second portion;
where the display module further includes: a cell tape configured to connect the display panel to the backlight module;

where the cell tape includes:

a first region, attached to an edge of the first surface of the display panel;

a second region, attached to an edge of the second surface of the backlight module;

a folding region, arranged between the first region and the second region and connecting the first region to the second region, where the folding region of the cell tape corresponds to a region of the at least one folding portion of the circuit board.

Further, the circuit board has a plurality of folding portions, at least one avoidance portion is arranged in the folding region of the cell tape along an extending direction of the first edge of the display panel, and none of the at least one avoidance portion contacts the folding portions of the circuit board.

Further, a plurality of avoidance portions is provided in the folding region of the cell tape along the extending direction of the first edge of the display panel, and the plurality of avoidance portions is arranged at intervals. The avoidance portions are arranged at positions in one-to-one correspondence with the folding portions of the circuit board, and a projection of each of the avoidance portions in a direction parallel to a plane where the display panel is provided and perpendicular to the extending direction of the first edge of the display panel covers a projection of each of the folding portions in the same direction.

Further, the avoidance portions include openings in the folding region of the cell tape.

Further, the avoidance portions includes cavities arranged in the folding region of the cell tape and extending along a direction away from the folding portions.

Further, the circuit board has a plurality of folding portions, at least one avoidance portion is arranged in the folding region of the cell tape along an extending direction of the first edge of the display panel, and the at least one avoidance portion contacts at least a portion of each folding portion of the circuit board.

Further, a plurality of avoidance portions is arranged in the folding region of the cell tape along the extending direction of the first edge of the display panel, and the plurality of avoidance portions is arranged at intervals. Avoidance portions are arranged at positions in one-to-one correspondence with the folding portions of the circuit board, and a projection of each of the avoidance portions in a direction parallel to a plane where the display panel is provided and perpendicular to the extending direction of the first edge of the display panel covers a projection of each of the folding portions in the same direction.

Further, each of the avoidance portions contacts all portions of the corresponding folding portion.

Further, the folding region of the cell tape includes a first tape and a second tape. Each of the avoidance portions corresponds to the first tape, and the portion of the folding region excepting the avoidance portions corresponds to the second tape. Elasticity of the first tape is greater than elasticity of the second tape.

Further, each of the avoidance portions contacts at least a portion of the corresponding folding portion.

Further, each of the avoidance portions comprises a plurality of openings, and the portion of each of the avoidance portions excepting the openings contacts the corresponding folding portion, and each of the openings is a hole in the folding region with a predetermined diameter.

The present disclosure provides the following beneficial effects:

as for the display module of the present disclosure, an avoidance portion is provided at a folding region of a cell tape so that when a display module is assembled, the cell tape can avoid an open circuit board at a position where the cell tape contacts the folding portion of the circuit board. In such a way, the cell tape will not apply a pressure that is pulled to a back surface of the display panel to the circuit board. Therefore, the circuit board does not pull the drive IC, thereby avoiding the adverse light leakage phenomenon that is generated when the circuit board bears the pressure from the cell tape to cause the display panel to be locally deformed due to stress, and the LO leakage phenomenon is improved.

DETAILED DESCRIPTION

The principle and the features of the present disclosure will be described hereinafter in conjunction with the drawings. The following embodiments are for illustrative purposes only, but shall not be used to limit the scope of the present disclosure.

Figure 1:
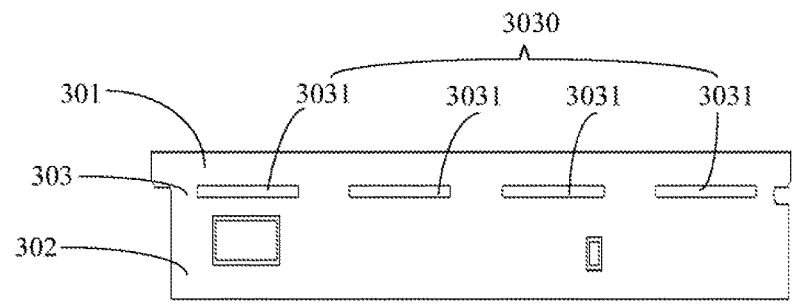
FIG. 1 is a schematic view of a cell tape in a display module in some embodiments of the present disclosure.
Figure 2:
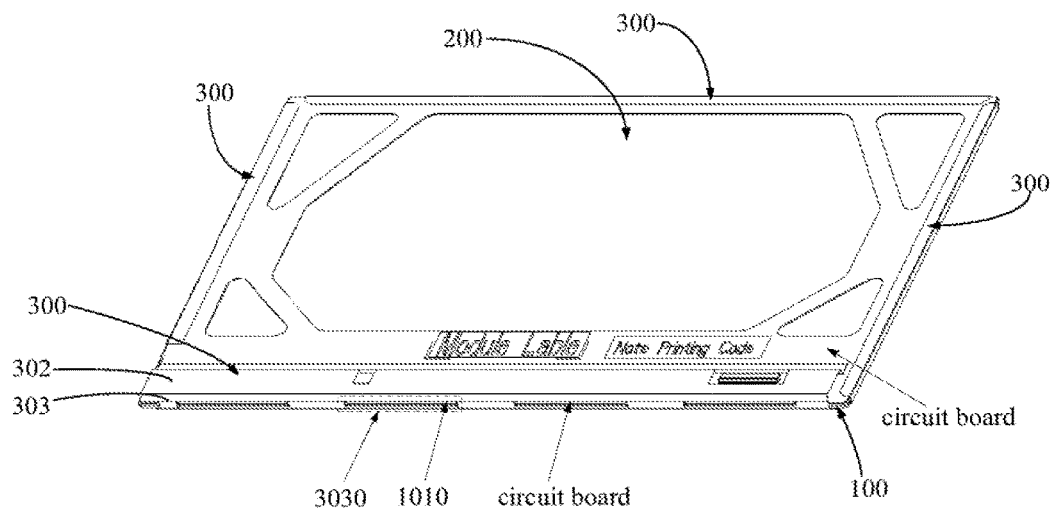
FIG. 2 is a schematic view of a display module in some embodiments of the present disclosure.
Figure 3:
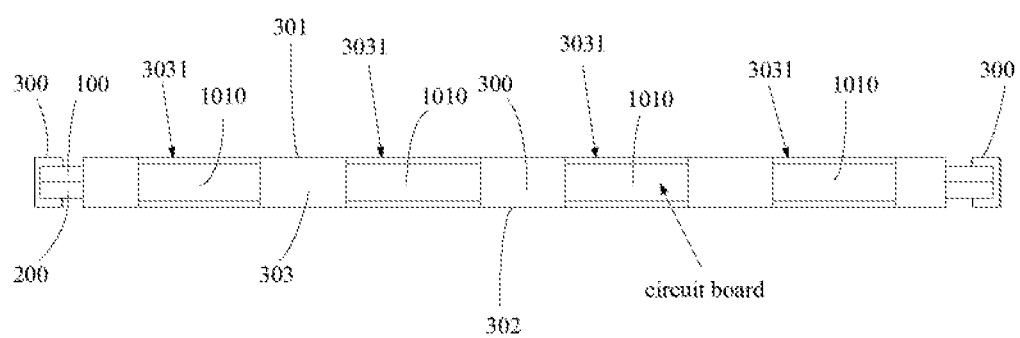
FIG. 3 is a side view of a display module shown in FIG. 2.

As shown in FIGS. 1 to 3, the present disclosure provides a display module, including: a display panel 100 and a backlight module 200 opposite to the display panel 100 A circuit board is arranged at a first edge of the display panel, The circuit board is folded to extend from a first surface of the display panel 100 away from the backlight module to a second surface of the backlight module away from the display panel 100. At least one folding portion 1010 is arranged at a portion of the circuit board between the display panel 100 and the backlight module 200. The display module further includes a cell tape 300 configured to at least cover each folding portion 1010 and connect the display panel 100 to the backlight module 200.

The cell tape 300 includes: a first region 301, which is attached to an edge of the first surface of the display panel 100, a second region 302, which is attached to an edge of the second surface of the backlight module 200, and a folding region 303, which is arranged between the first region 301 and the second region 302. An avoidance portion 3030 is arranged in the folding region 303, and is configured to avoid the folding portion 1010 of the circuit board.

In the above technical solution, an avoidance portion 3030 is arranged at a folding region 303 of the cell tape 300 so that when the display module is assembled, the portion of the cell tape 300 corresponding to the folding portion 1010 of the circuit board may avoid the circuit board, then the cell tape 300 will not press the display panel 100 along a direction towards to the back of the display panel 100. Therefore, the circuit board will not pull the display panel 100, thereby avoiding the adverse light leakage in the related art that is generated when the circuit board is subjected to the pressure from the cell tape 300 to cause the display panel 100 to be locally deformed, and the LO leakage is avoided.

Some of the embodiments of the present disclosure are described in detail in the following.

FIG. 1 is a schematic view of a cell tape in a display module in some embodiments of the present disclosure. FIG.

2 is a schematic view of a display module in some embodiments of the present disclosure. FIG. 3 is a side view of a display module in some embodiments of the present disclosure.

The present disclosure provides a display module. As shown in FIGS. 1 to 3, the display module includes: a display panel 100 and a backlight module 200 opposite to the display panel 100 A circuit board is arranged at a first edge of the display panel, The circuit board is folded to extend from a first surface of the display panel 100 away from the backlight module to a second surface of the backlight module away from the display panel 100. At least one folding portion 1010 is arranged at a portion of the circuit board between the display panel 100 and the backlight module 200. The display module further includes a cell tape 300 configured to fix the display panel 100 to the backlight module 200.

The cell tape 300 includes: a first region 301, which is attached to an edge of the first surface of the display panel 100, a second region 302, which is attached to an edge of the second surface of the backlight module 200, and a folding region 303, which is arranged between the first region 301 and the second region 302. The folding region 303 corresponds to the region of the at least one folding portion. At least one avoidance portion 3030 is arranged in the folding region 303 and configured to avoid the corresponding folding portion 1010 of the circuit board, and each of the at least one avoidance portion 3030 is an opening 3031 formed by hollowing out a portion of the folding region 303 facing the corresponding folding portion 1010.

According to the technical solution hereinabove, each of the at least one opening 3031 is formed at the portion of the folding region 303 of the cell tape 300 facing the corresponding folding portion 1010. When the display module is assembled, the circuit board is folded to extend from the first surface of the display panel 100 to the second surface of the backlight module 200 firstly. Then, the first region 301 of the cell tape 300 is attached onto an edge of the first surface of the display panel 100, and each of the at least one opening 3031 of the folding region 303 of the cell tape 300 is aligned to the corresponding folding portion 1010 of the circuit board so that the corresponding folding portion 1010 is placed into the opening 3031. Finally, the second region 302 is folded and attached onto the edge of the second surface of the backlight module 200. Then, during the whole assembling process, since the opening 3031 in the cell tape 300 does not press against the folding portion 1010 of the circuit board, the circuit board will pull the display panel 100, thereby avoiding the adverse light leakage caused when the display panel 100 is pulled by the circuit board.

According to the above technical solution, the structure of the cell tape 300 is simple, and it is merely required to form an opening 3031 at a portion of the cell tape 300 facing the folding region 1010 of the circuit board. When the tapes are produced or the display module is assembled, it is merely required to form an opening 3031 in the cell tape 300 by carving the cell tape 300, without any additional cost. Therefore, such cell tape 300 is economical and practical.

In some embodiments of the present disclosure, the circuit board in a display module includes a drive IC, an printed circuit board and at least one flexible circuit board connecting the drive IC to the printed circuit. The drive IC circuit is bonded to the display panel 100, each flexible circuit board is folded to extend from the first surface of the display panel 100 to the second surface of the backlight module 200, thereby forming the folding portion 1010, and the printed circuit board is fixed onto the second surface of the backlight module 200. Each folding portion 1010 generally is rectangular along an extending direction of the first edge of the display panel 100. In some embodiments of the present disclosure, alternatively, as shown in FIGS. 1 to 3, each opening 3031 is rectangular, and each rectangular opening 3031 extends along a direction identical to the first edge of the display panel 100.

According to the technical solution hereinabove, the shape of each opening 3031 is rectangular, which is matched with the shape of the corresponding folding portion 1010 of the circuit board, thereby not only avoiding the corresponding folding portion 1010 of the circuit board in one aspect but also effectively fixing the other portions of the circuit board excepting the folding portions 1010 in another aspect.

In some embodiments of the present disclosure, alternatively, as shown in FIG. 2, each opening is a hole of a predetermined diameter. In other words, a plurality of folding portions 1010 is formed on the circuit board of the display panel 100 at intervals. A plurality of openings 3031 is arranged in the folding region 303 of the cell tape 300 at intervals, which is in one-to-one correspondence to positions of the folding portions 1010.

Generally, the flexible circuit board consists of several flexible strip-like circuit boards. When the flexible circuit board is folded, the strip-like circuit boards form the folding portions 1010. Therefore, in the above technical solution, for matching the structure of the flexible circuit board, the openings 3031 which are in one-to-one correspondence with the folding portions 1010 are arranged in the folding region 303 of the cell tape 300. In such a way, each of the folding portions 1010 may be placed in the corresponding opening 3031 so as to prevent the cell tape 300 from pulling the flexible circuit board.

In addition, according to the above technical solution, when each folding portion 1010 is relatively long in the extending direction of the first edge of the display panel, the fixing ability of the cell tape may be weakened if each opening 3031 is designed to have the same length with the corresponding folding portion 1010. At this time, the openings 3031 may be designed to be a plurality of holes of predetermined diameters.

In some embodiments of the present disclosure, alternatively, as shown in FIGS. 1 to 3, the flexible circuit board is provided with four folding portions 1010. Correspondingly, four openings 3031 are provided on the folding region 303 of the cell tape 300.

It should be noted that, in some embodiments of the present disclosure, the shapes and the number of the openings 3031 may be reasonably adjusted according to the structure of the folding portion 1010 of the circuit board as needed, which is not limited herein. For example, in some embodiments of the present disclosure, the shape of the opening can be a hole in a rectangular or elongated shape, can be an elongated hole in an ellipse or circle shape, or can be an elongated hole in irregular shapes. The specific shape of the opening is not limited.

In addition, in some embodiments of the present disclosure, alternatively, a length of each opening 3031 along the extending direction of the first edge of the display panel is equal to or greater than a length of each folding portion 1010 along the extending direction of the first edge of the display panel.

Furthermore, a width of each opening 3031 along a second direction perpendicular to the plane where the display panel 100 is provided is equal to or greater than a width of each folding portion 1010 in the second direction.

According to the above technical solution, the folding portion 1010 of the circuit board my still be subjected to a pressure if a size of each opening 3031 is smaller than that of the corresponding folding portion 1010. Therefore, in some embodiments of the present disclosure, the size of each opening 3031 is designed to be slightly greater than the size of the corresponding folding portion 1010. In such a way, it may be further guaranteed that the circuit board may not be pulled, thereby avoiding the LO leakage further.

It should be noted that, the specific size of the opening 3031 can be reasonably designed according to the structure of the folding portion 1010 of the flexible circuit board on the display modules of different types.

In some embodiments of the present disclosure, there are a plurality of folding portions 1010 on the flexible circuit board and only one opening. A length of the opening along the extending direction of the first edge is greater than or equal to a total length of a plurality of folding portions 1010 along the extending direction of the first edge, and a width of the opening along the second direction is greater than or equal to a width of each folding portion 1010 along the second direction.

According to the above solution, it is only required to arrange one opening in the cell tape 300, and thus the structure is simple. In addition, the circuit board may be avoided to be pulled in one aspect, and the circuit board may be fixed in another aspect.

In some embodiments of the present disclosure, the avoidance portion 3030 includes a cavity arranged in the folding region 303 and extending along a direction away from the folding portion 1010.

That is, a cavity can be provided at a position of the cell tape facing the folding portion 1010 of the circuit board faces to replace the opening 3031 in some embodiments of the present disclosure, so as to prevent the cell tape 300 from contacting the folding portion 1010 of the circuit board, thereby preventing the cell tape 300 from pressing the folding portion 1010 of the circuit board due to pulling the folding portion 1010 towards to the second surface of the backlight module 200 and avoiding the LO light leakage.

In some embodiments of the present disclosure, alternatively, the cavity is rectangular and extends along the first direction.

According to the above technical solution, the cavity is rectangular and matched with the shape of the folding portion 1010 of the circuit board, thereby avoiding the folding portion 1010 of the circuit board in one aspect and effectively fixing the other portions of the circuit board excepting the folding portion 1010 in another aspect.

In some embodiments of the present disclosure, alternatively, a plurality of folding portions 1010 are arranged at intervals on the flexible circuit board on the display panel 100. A plurality of cavities arranged at intervals, which is in one-to-one correspondence with the folding portions 1010, is arranged in the folding region 303 of the cell tape 300.

According to the above technical solution, the flexible circuit board generally consists of several flexible strip-like circuit boards. When the flexible circuit board is folded, the strip-like circuit boards serve as the folding portions 1010. Therefore, for matching the structure of the flexible circuit board, the cavities which are in one-to-one correspondence with the folding portions 1010 are provided in the folding region 303 of the cell tape 300. In such a way, each of the folding portions 1010 can be placed in the corresponding cavity so as to prevent the cell tape 300 from pulling the flexible circuit board.

In some embodiments of the present disclosure, alternatively, the flexible circuit board is provided with four folding portions 1010. Correspondingly, four cavities are provided in the folding region 303 of the cell tape 300.

It should be noted that, in some embodiments of the present disclosure, the shapes and the number of the cavities can be reasonably adjusted according to the structure of the folding portions 1010 of the circuit board in actual situations, which is not limited herein. For example, in some embodiments of the present disclosure, the shape of the cavity can be preferably a hole in a rectangular or elongated shape, can be an elongated hole in an ellipse or circle shape, or can be an elongated hole in irregular shapes. The specific shape of the cavity is not limited.

In addition, in some embodiments of the present disclosure, alternatively, a length of each cavity along the extending direction of the first edge is equal to or greater than a length of the corresponding folding portion 1010 along the extending direction of the first edge. A width of each cavity along the second direction perpendicular to the plane where the display panel 100 is provided is greater than or equal to a width of the corresponding folding portion 1010 along the second direction.

According to the above technical solution is adopted, the folding portions 1010 of the circuit board may still be pressed if a size of each cavity is smaller than a size of the corresponding folding portion 1010. Therefore, in some embodiments of the present disclosure, the size of each cavity is designed to be slightly greater than the size of the corresponding folding portion 1010. In such a way, it may be further guaranteed that the circuit board may not be pulled, and the LO leakage may be further avoided.

It should be noted that, the specific size of the cavity can be reasonably designed according to the structure of the folding portion 1010 of the flexible circuit board on the display modules of different types.

In some embodiments of the present disclosure, the folding region of the cell tape corresponds to all the folding portions as a whole, and a region of the cell tape corresponding to the folding portions has an elasticity greater than elasticities of other regions. That is, the first tape is used at positions of the folding region 303 facing the folding portions 1010 of the circuit board, so as to form the avoidance portions 3030, and the second tape is used at positions of the folding region 303 not facing the folding portion 1010 of the circuit board. The elasticity of the first tape is greater than that of the second tape.

According to the above technical solution, the portions of the cell tape 300 facing the folding portions are of a relatively large elasticity, so as to replace the openings 3031 in some embodiments of the present disclosure. When the cell tape 300 contacts the folding portions 1010 of the circuit board, the avoidance portions 3030 are of a relatively large elasticity, so the avoidance portions 3030 may bear a relatively large deformation, thereby reducing the pressure onto the folding portion 1010 of the circuit board applied by the cell tape 300 due to pulling the folding portion 1010 towards to the second surface of the backlight module 200 and avoiding the LO light leakage.

In some embodiments of the present disclosure, alternatively, each avoidance portion 3030 is rectangular and extends along the first direction.

According to the above technical solution, each avoidance portion 3030 is rectangular and matched with the shape of the corresponding folding portion 1010 of the circuit portion, thereby avoiding the folding portion 1010 of the circuit board in one aspect and effectively fixing the other portions of the circuit board excepting the folding portions 1010 in another aspect.

In some embodiments of the present disclosure, alternatively, a plurality of folding portions 1010 is arranged at intervals on the flexible circuit board of the display panel 100. A plurality of avoidance portions 3030 arranged at intervals, that are which is in one-to-one correspondence with the folding portions 1010, is arranged in the folding region 303 of the cell tape 300.

According to the above technical solution, the flexible circuit board generally consists of several flexible strip-like circuit boards. When the flexible circuit board is folded, the strip-like circuit boards serve as the folding portions 1010. Therefore, for matching the structure of the flexible circuit board, a plurality of avoidance portions which is in one-to-one correspondence with the folding portions 1010 and of a relatively large elasticity, is formed in the folding region 303 of the cell tape 300, thereby preventing the cell tape 300 from pulling the flexible circuit board.

In some embodiments of the present disclosure, alternatively, the flexible circuit board is provided with four folding portions 1010. Correspondingly, four avoidance portions 3030 are provided in the folding region 303 of the cell tape 300.

It should be noted that, in some embodiments of the present disclosure, the shapes and the number of the avoidance portions can be reasonably adjusted according to the structure of the folding portion 1010 of the circuit board in actual situations, which is not limited herein.

In addition, in some of the embodiments of the present disclosure, alternatively, a length of each avoidance portion 3030 along the first direction is equal to or greater than a length of the corresponding folding portion 1010 facing the avoidance portion 3030 along the extending direction of the first edge. A width of each avoidance portion 3030 along the second direction perpendicular to the plane where the display panel 100 is provided is greater than or equal to a width of the corresponding folding portion 1010 facing the avoidance portion 3030 along the second direction.

According to the above technical solution is adopted, the folding portions 1010 of the circuit board may still be pressed if a size of each avoidance portion 3030 is smaller than a size of the corresponding folding portion 1010. Therefore, in some embodiments of the present disclosure, the size of each avoidance portion 3030 is designed to be slightly greater than the size of the corresponding folding portion 1010. In such a way, it may be further guaranteed that the circuit board may not be pulled, and the LO leakage may be further avoided.

It should be noted that, the specific size of the avoidance portion 3030 can be reasonably designed according to the structure of the folding portion 1010 of the flexible circuit board on the display modules of different types.

It should be further noted that, the above embodiments are several preferred embodiments of display module of the present disclosure. In actual applications, the display module are not limited thereto. For example, the avoidance portion 3030 may be of other structures or other shapes. In addition, the avoidance portion 3030 may be provided at other positions excepting the position facing the folding portion 1010 of the circuit board, as long as pull applied to the circuit board may be reduced and the circuit board may be fixed.

In addition, it should be noted that, as shown in FIG. 2, the cell tape used in the first edge of the display panel where the circuit board is provided may be the cell tape provided in some embodiments of the present disclosure and the cell tapes used at other edges of the display panel where the circuit boards are not provided may be the cell tapes in related art. Of course, the cell tapes provided in some embodiments of the present disclosure can be used.

In addition, the present disclosure further provides a display device, which includes the above-mentioned display module.

The above are merely the preferred embodiments of the present disclosure. It should be noted that, a person skilled in the art may make further modifications and improvements without departing from the principle of the present disclosure, and these modifications and improvements shall also fall within the scope of the present disclosure.

What is claimed is:

1. A display module, comprising:
   a display panel and a backlight module opposite to the display panel, wherein a circuit board is arranged at a first edge of the display panel, the circuit board is folded to extend from a first surface of the display panel away from the backlight module to a second surface of the backlight module away from the display panel, and a part of the circuit board between the display panel and the backlight module includes a plurality of folding portions separated from each other,
   wherein the display module further comprises a cell tape configured to connect the display panel to the backlight module,
   wherein the cell tape comprises:
      a first region, attached to an edge of the first surface of the display panel;
      a second region, attached to an edge of the second surface of the backlight module;
      a folding region, which is arranged between the first region and the second region, and connects the first region to the second region; and
      avoidance portions which are arranged in a one-to-one correspondence with the folding portions and separated from each other arranged in the folding region of the cell tape;
      the avoidance portions are openings in the folding region of the cell tape;
      wherein a length of each of the avoidance portions along an extending direction of the first edge is greater than a length of the corresponding folding portion along the extending direction of the first edge, and a width of each of the avoidance portions along a second direction perpendicular to a first surface of the display panel is greater than a width of the corresponding folding portion along the second direction.

2. The display module according to claim 1, wherein the openings are rectangular and extend along a direction identical to the first edge of the display panel.

3. The display module according to claim 1, wherein the openings are holes of predetermined diameters.

4. The display module according to claim 1, wherein at least one of the avoidance portions comprises at least one cavity arranged in the folding region of the cell tape and extending along a direction away from the folding portion.

5. The display module according to claim 1, wherein the folding region of the cell tape corresponds to the folding portions as a whole, and a region of the cell tape corresponding to each of the folding portions is of elasticity greater than the other regions of the cell tape.

6. The display module according to claim 1, wherein the circuit board comprises a drive integrated circuit (IC), a printed circuit board, and at least one flexible circuit board connecting the drive IC to the printed circuit board, wherein the drive IC is bonded to the display panel, each of the at least one flexible circuit board is folded to extend from the first surface of the display panel to the second surface of the backlight module so as to form the folding portions and fix the printed circuit board onto the second surface of the backlight module.

7. A display device, comprising the display module according to claim 1.

8. The display module according to claim 1, wherein the cell tape is independent from the circuit board.

9. A display module, comprising:
   a display panel and a backlight module opposite to the display panel, wherein a circuit board is arranged at a first edge of the display panel, the circuit board is folded to extend from a first surface of the display panel away from the backlight module to a second surface of the backlight module away, from the display panel;
   wherein the circuit board comprises:
      a first portion, bonded to the first surface of the display panel;
      a second portion, fixed onto the second surface of the backlight module; and
      a plurality of folding portions separated from each other at a part of the circuit board between the display panel and the backlight module;
   wherein the display module further comprises a cell tape configured to connect the display panel to the backlight module;
   wherein the cell tape comprises:
      a first region, attached to an edge of the first surface of the display panel;
      a second region, attached to an edge of the second surface of the backlight module;
      a folding region, arranged between the first region and the second region and connecting the first region to the second region;
      wherein the folding region of the cell tape corresponds to a region of the folding portions separated from each other; and
      avoidance portions which are arranged in a one-to-one correspondence with the folding portions and separated from each other arranged in the folding region;
      the avoidance portions are openings in the folding region of the cell tape;
   wherein a length of each of the avoidance portions along an extending direction of the first edge is greater than a length of the corresponding folding portion along the extending direction of the first edge, and a width of each of the avoidance portions along a second direction perpendicular to a first surface of the display panel is greater than a width of the corresponding folding portion along the second direction.

10. The display module according to claim 9, wherein the avoidance portions comprise cavities arranged in the folding region of the cell tape and extending along a direction away from the folding portions.

11. The display module according to claim 9, Wherein the avoidance portions contact at least a portion of the folding portions of the circuit board.

12. The display module according to claim 11, wherein the avoidance portions are arranged at intervals; and
   wherein projection of each of the avoidance portions in a direction parallel to a plane where the display panel is provided and perpendicular to the extending direction of the first edge of the display panel covers a projection of each of the folding portions in the same direction.

13. The display module according to claim 12, wherein each of the avoidance portions contacts all portions of the corresponding folding portion.

14. The display module according to claim 13, wherein the folding region of the cell tape comprises a first tape and a second tape,
   each of the avoidance portions corresponds to the first tape, and the portion of the folding region excepting the avoidance portions corresponds to the second tape,
   wherein elasticity of the first tape is greater than elasticity of the second tape.

* * * * *